(12) United States Patent
Ishida et al.

(10) Patent No.: US 10,900,143 B2
(45) Date of Patent: Jan. 26, 2021

(54) POLYCRYSTALLINE SILICON ROD

(71) Applicant: Tokuyama Corporation, Yamaguchi (JP)

(72) Inventors: Haruyuki Ishida, Yamaguchi (JP); Tetsuya Imura, Yamaguchi (JP); Yasumasa Aimoto, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 201 days.

(21) Appl. No.: 14/383,577

(22) PCT Filed: Feb. 27, 2013

(86) PCT No.: PCT/JP2013/055143
§ 371 (c)(1),
(2) Date: Sep. 8, 2014

(87) PCT Pub. No.: WO2013/136984
PCT Pub. Date: Sep. 19, 2013

(65) Prior Publication Data
US 2015/0107508 A1 Apr. 23, 2015

(30) Foreign Application Priority Data
Mar. 16, 2012 (JP) .............................. 2012-061096

(51) Int. Cl.
*C30B 29/66* (2006.01)
*C01B 33/035* (2006.01)
(Continued)

(52) U.S. Cl.
CPC ............ *C30B 29/66* (2013.01); *C01B 33/035* (2013.01); *C30B 11/02* (2013.01); *C30B 15/00* (2013.01);
(Continued)

(58) Field of Classification Search
CPC ....... C01B 33/035; C30B 15/00; C30B 29/66; C30B 11/02; C30B 29/06; C30B 29/607; Y10T 428/12674
See application file for complete search history.

(56) References Cited

U.S. PATENT DOCUMENTS 3,809,571 A 5/1974 Berlat et al.
5,904,981 A * 5/1999 Oda .................... C30B 25/00
428/364
(Continued)

FOREIGN PATENT DOCUMENTS

JP 9-175808 A 7/1997
JP 09175808 A * 7/1997
(Continued)

OTHER PUBLICATIONS

International application No. PCT/JP2013/055143, Notification of Transmittal Translation of the International Preliminary Report on Patentability (Chapter I or Chapter II), dated Sep. 25, 2014.
(Continued)

*Primary Examiner* — Hua Qi
(74) *Attorney, Agent, or Firm* — Cahn & Samuels, LLP (57) ABSTRACT

A polycrystalline silicon rod is formed of polycrystalline silicon deposited radially around a silicon core line and is characterized by, in a cross-section that is a perpendicular cut in respect to the axial direction of a cylindrical rod, a ratio of surface area covered by coarse crystal particles having a diameter of 50 μm or greater is 20% or more of the crystal observed at the face, excluding the core line portion.

22 Claims, 4 Drawing Sheets

(51) Int. Cl.
*C30B 29/60* (2006.01)
*C30B 29/06* (2006.01)
*C30B 11/02* (2006.01)
*C30B 15/00* (2006.01)

(52) U.S. Cl.
CPC ............ *C30B 29/06* (2013.01); *C30B 29/607* (2013.01); *Y10T 428/12674* (2015.01)

(56) References Cited

U.S. PATENT DOCUMENTS

| | | | |
|---|---|---|---|
| 7,364,715 B2 | 4/2008 | Nawata et al. | |
| 2003/0150378 A1* | 8/2003 | Winterton | C01B 33/035 117/87 |
| 2008/0286550 A1* | 11/2008 | Sofin | C30B 13/00 428/220 |
| 2010/0021210 A1 | 1/2010 | Maezawa et al. | |
| 2012/0048178 A1 | 3/2012 | Schaefer et al. | |
| 2014/0004377 A1* | 1/2014 | Kaito | C30B 29/06 428/636 |

FOREIGN PATENT DOCUMENTS

| | | |
|---|---|---|
| JP | 2005-517621 A | 6/2005 |
| JP | 2008-285403 A | 11/2008 |
| JP | 2012-51788 A | 3/2012 |

OTHER PUBLICATIONS

English Abstract of JP 2008-285403.
English Abstract of JP 9-175808.
Extended European Search Report for EP 13760309.8, dated Feb. 12, 2016.

\* cited by examiner

Fig. 4
(Sample 2)

Fig.5
(Sample 4)

Fig.6
(Sample 6)

POLYCRYSTALLINE SILICON ROD

This application is a U.S. national stage application of PCT/JP2013/055143 filed on 27 Feb. 2013, and claims priority to Japanese patent document 2012-061096 filed on 16 Mar. 2012, the entireties of which are incorporated herein by reference.

The present inventions relates to a polycrystalline silicon rod, and further specifically a polycrystalline silicon rod preferably used as the production source material of the silicon single crystal by a Czochralski (CZ) method or the production source material of the silicon ingot by a casting method.

DESCRIPTION OF THE RELATED ART

As the method for producing the polycrystalline silicon which is the source material of the silicon single crystal, Siemens method is known. The Siemens method obtains the high purity polycrystalline silicon rod by heating up to the silicon core wire placed inside the reaction chamber of a bell jar type the depositing temperature of the silicon by electric conduction; and supplying the hydrogen and the gas of silane compound such as trichlorosilane ($SiHCl_3$) or monosilane ($SiH_4$) or so, and then the polycrystalline silicon is deposited on the silicon core wire by a chemical vapor deposition method. Thereby, the high purity polycrystalline silicon rod is obtained. In the production of the silicon single crystal by CZ method, the polycrystalline silicon rod is pulverized to an appropriate size, introduced into a melting crucible to melt, and then the single crystal ingot is pulled out by using the seed crystal. Also, in the production of the silicon ingot by the casting method, similarly, it is introduced into the melting crucible to melt, and then the ingot is formed by cool solidification of the melted solution.

The melting of the polycrystalline silicon rod is carried out by applying the heat to the melting crucible filled with the fragmented pieces under inactive atmosphere. The present inventors have carried out various tests to improve the energy efficiency during the melting; and it was found that the thermal energy required for the melting differs depending on the characteristic of the polycrystalline silicon rod of the source material.

In Patent document 1 (JP Patent Application Laid Open No. 2008-285403), in order to prevent the cracking or the breaking of the polycrystalline silicon rod, the polycrystalline silicon rod having reduced content of the needle like crystal, and mostly constituted by fine particle is disclosed.

PRIOR ART DOCUMENT

[Patent Article 1] JP Patent Application Laid Open No. 2008-285403

However, the polycrystalline silicon rod mainly constituted by the fine crystals such as in patent document 1 requires long time for the melting, and the energy amount tends to increase. Based on this knowledge, it was speculated that the size of the crystal particle constituting the rod significantly influences the melting property of the polycrystalline silicon rod; hence the present inventors has carried out keen examination and found that the energy amount required for the melting tends to decrease as the crystal particle constituting the rod becomes coarse, and as the ratio of the coarse particle becomes large. Thereby, the present invention was achieved.

The present invention is achieved in view of the above mentioned finding, and its object is to provide the polycrystalline silicon rod having less energy amount required for the melting and capable of contributing to reduce the energy cost when using as the silicon single crystal production source material or as the casting method silicon ingot production source material.

SUMMARY OF INVENTION

The present invention includes the following gist to achieve the above mentioned abject.

(1) A polycrystalline silicon rod radially depositing a polycrystalline silicon around a silicon core wire, wherein at a cross section face which is a perpendicular cut of a rod having a column shape against an axial direction, an area ratio of a coarse crystal particle having a long diameter of 50 μm or more is 20% or more among crystals observed at the face excluding the core wire part.

(2) The polycrystalline silicon rod as set forth in (1), wherein said coarse crystal particle has an average long diameter of 50 to 1000 μm.

(3) The polycrystalline silicon rod as set forth in (1) or (2), wherein a diameter is 90 to 180 mm.

(4) The polycrystalline silicon rod as set forth in (1) radially depositing a polycrystalline silicon around a silicon core wire, wherein a thermal conductivity of a cross section direction is 100 to 150 W/mK at a cross section of depositing direction excluding the core wire thereof.

(5) The polycrystalline silicon rod as set forth in any one of (1) to (4) used as a production source material of single crystal by a Czochralski method or a production source material of silicon ingot by a casting method.

The polycrystalline silicon rod of the present invention has characteristic fine structure, and a high thermal conductivity. This means that the energy required for the melting will be less compared to the polycrystalline silicon rod of the same amount. Therefore, the polycrystalline silicon rod of the present invention can contribute to reduce the energy cost when used as the silicon single crystal production source material or as the casting method silicon ingot production method.

DETAILED DESCRIPTION OF INVENTION

Hereinafter, the present invention will be described based on the embodiments.

Figure 1:
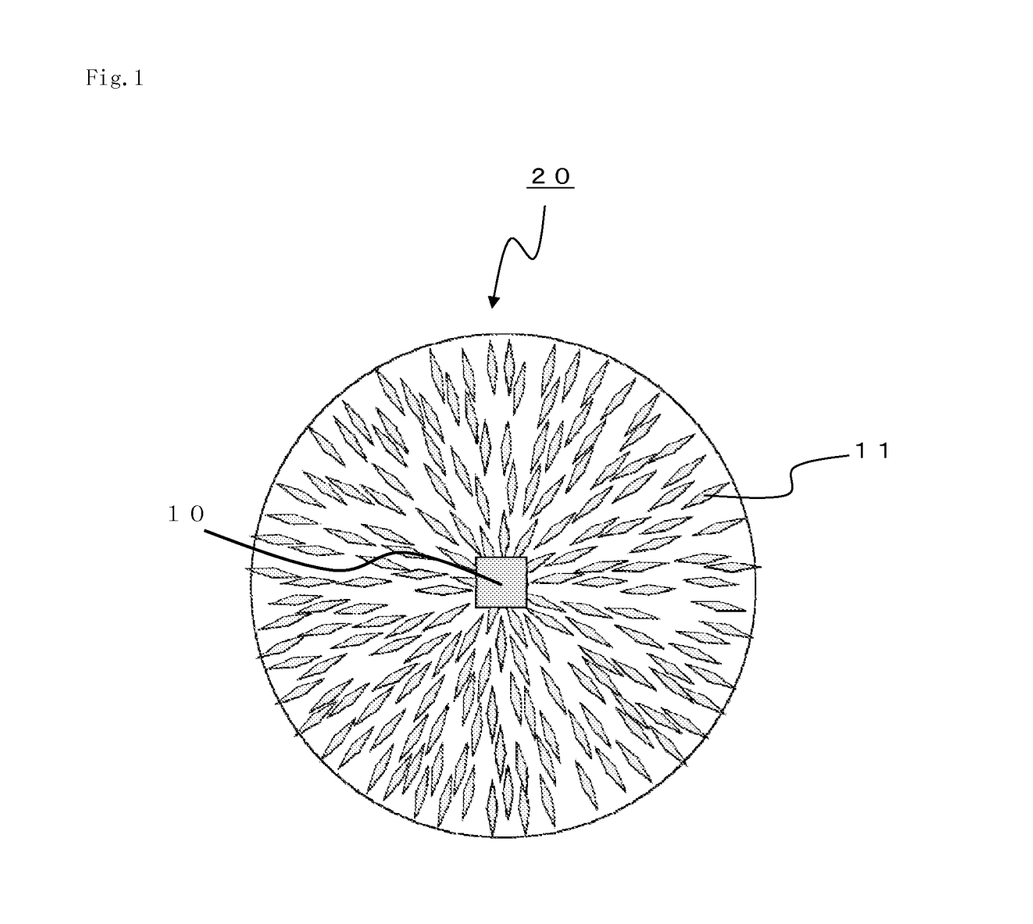
FIG. 1 is a schematic diagram of the cross section of polycrystalline silicon rod according to one embodiment of the present invention.

The polycrystalline silicon rod 20 according to the present invention is deposited with the polycrystalline silicon around the silicon core wire, as shown in the schematic view of the cross section in FIG. 1. Polycrystalline silicon is also called as polysilicon, and usually it is an aggregate of fine silicon crystal. In the polysilicon crystalline rod of the present invention, the polycrystalline silicon is mainly made of the coarse crystal particle 11. Specifically, when observing the radial cross section (the cross section perpendicular against the axial direction) of the polycrystalline silicon rod 20, the average value of the ratio of the area of the coarse crystal particle 11 in the arbitrary field of vision excluding the core wire 10 is 20% or more, preferably 25% or more, and further preferably 35% or more. Also, in the further preferable embodiment, the ratio of the area of the coarse crystal particle 11 in any region excluding the core wire 10 is 20% or more, preferably 25% or more, and further preferably 35% or more. Here, the coarse crystal particle is a particle having 50 μm or longer long diameter of the crystal particle observed at the cross section face approximately perpendicular against the axial direction of the rod.

The shape observed at the cross section of the coarse crystal particle 11 is not particularly limited, and it may differ depending on the appearance of the crystal particle at the cross section. For example, in case the shape of the crystalline itself is a needle shape, when the crystalline lies at the cross section face, the cross section may change to needle shape, or depending on how the needle like crystalline stands up, the cross section may change to approximate oval shape or approximate circular shape. Therefore, in the present invention, the long diameter of the coarse crystalline is the crystalline length in the longitudinal direction of the observed face in case of atypical shape particle such as needle shape, approximate oval shape or so, and if it is an approximate circular shape, then it corresponds to the diameter thereof. Also, the long diameter average value of said coarse particle is preferably 50 to 1000 μm, more preferably 70 to 800 μm.

When the polycrystalline silicon rod 20 includes the coarse crystal particle by the above mentioned area ratio, the melting takes place rapidly under the melting condition, and the energy cost can be reduced during the silicon single crystal production by CZ method or the silicon ingot production by casting method using the crucible. The reason of such effect is not necessarily clear, however it is speculated that by having relatively large amount of the coarse crystal particle, the particle boundary interfering the thermal transmission becomes less, thereby the thermal transmission efficiency increases.

The area ratio of the coarse crystal particle and the crystalline size thereof is obtained by carrying out the arithmetic processing of the image of the rod cross section. Specifically, first, the polycrystalline silicon rod 20 is cut approximately perpendicular against the axial direction to obtain the disk shape silicon wafer. Next, the observed face is polished to obtain a smooth face. Next, following the polishing, by carrying out the etching treatment depending on the needs, the smoothness of the observed face is further improved; thereby the contrast of the image taken at the observed face becomes further clear. The image may be taken by the camera connected to the computer, or the image data taken separately may be input the computer.

For the analysis of the obtained image data, "Azokun" (registered trademark) made by Asahi Kasei Engineering Corporation is used, and the particle analysis was carried out by the method described in the following example. By carrying out the particle analysis, the long diameter of the coarse crystalline, and the area ratio occupied by the coarse particle can be obtained.

Also, the diameter of the polycrystalline silicon rod is preferably 90 mm to 180 mm, more preferably 110 mm to 160 mm. The larger the polycrystalline silicon rod is, the more the amount of the source material can be obtained at the one production step.

Also, the thermal conductivity rate of the polycrystalline silicon rod is preferably 100 to 150 W/m·K, and more preferably 110 to 140 W/m·K. The larger the thermal conductivity is, the higher the thermal transmission efficiency is; and the melting takes place rapidly under the melting condition thus it is speculated that the energy cost can be reduced during the silicon single crystal production by CZ method or the silicon ingot production by casting method using the crucible.

For the measurement of the thermal conductivity, Laser flash method thermal constant measurement system is used. Specifically, by carrying out the method asserted in the following examples, it can be obtained by the below equation using the obtained specific heat, the thermal diffusivity, and the density.

Thermal conductivity=Specific heat×Thermal diffusivity×Density

The polycrystalline silicon rod 20 as mentioned in the above utilizes the characteristic of rapid melting under the melting condition, thereby it is preferably used as the source material of the silicon melt when producing the silicon single crystal by CZ method and/or when producing the silicon ingot by casting method using the crucible.

The polycrystalline silicon rod of the present invention can be obtained by Siemens method which regulates the deposition condition of the polycrystalline silicon. Siemens method uses the production devices equipped with the reaction chamber 2 which is generally called the bell jar as shown in the schematic diagram of FIG. 2.

Figure 2:
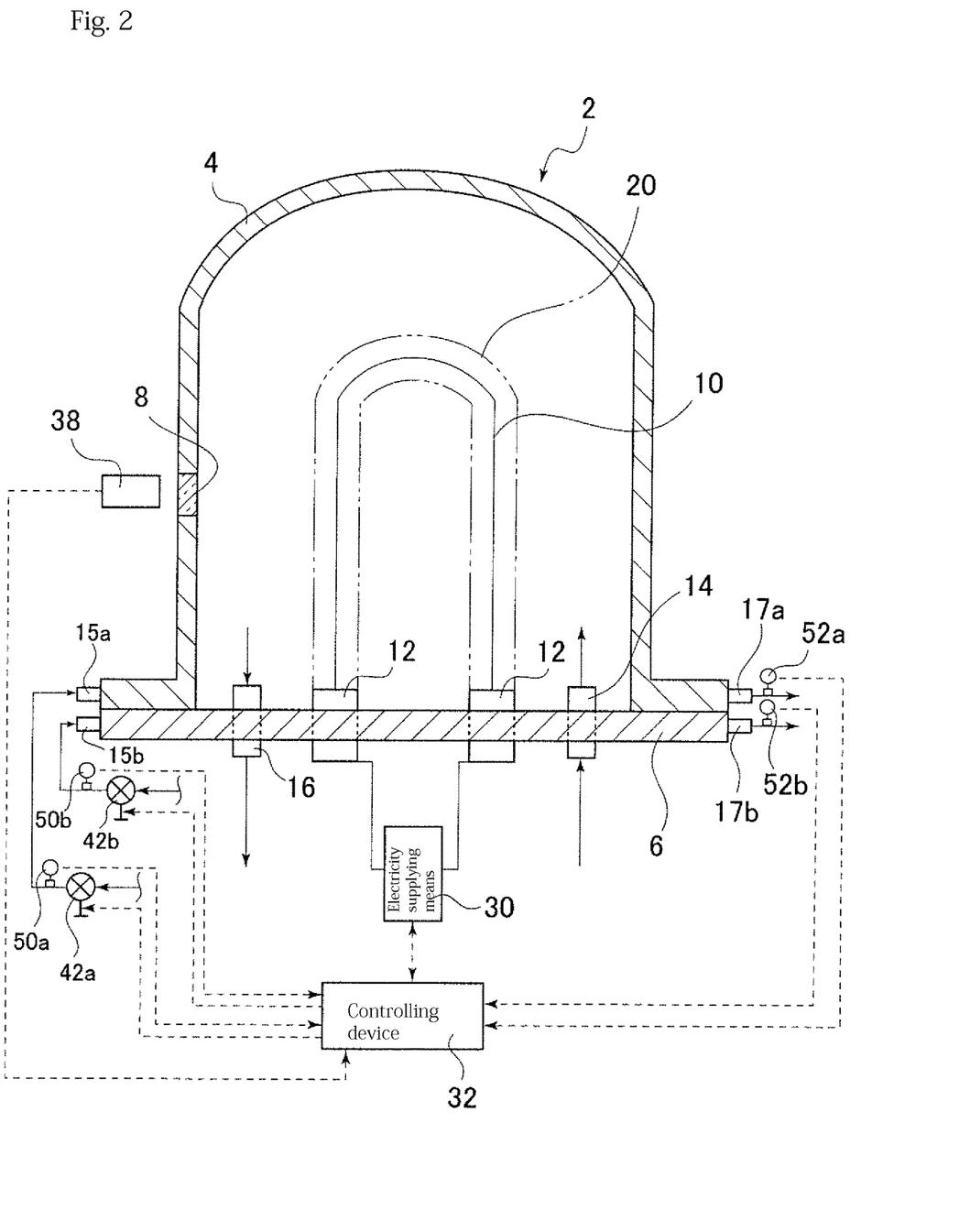
FIG. 2 shows an example of production device of the polycrystalline silicon rod.

The reaction chamber 2 of the typical production device comprises the cover 4 of bell jar type which is connected in a removable manner to the base board 6. At the base board 6, at least one pair of electrodes 12 is installed. The number of the electrodes 12 is determined in accordance with the number of the core wire 10 made of silicon placed inside the reaction chamber 2.

The core wire 10 made of silicon placed inside the reaction chamber 2 is placed in reversed U shape so that a pair of the electrode 12 can be connected to each other, thereby allowing the electric connection via the electrode 12. The electrodes are formed by carbon, SUS, Cu or so.

The core wire 10 is constituted by cutting out the rod shape member from the separately produced polycrystalline silicon rod, and by connecting these so that it is in a reversed U shape. The cross section shape of the short direction of the core wire may be any one of a circular shape, an oval shape, an approximate square shape, or a polygonal shape. For example, in case of the approximate square shape, the length of one side is 5 to 15 mm or so. By electrically connecting the core wire and supplying the reaction gas, the polycrystalline silicon is deposited around the core wire 10, and the rod 20 made of polycrystalline silicon is formed. The rod 20 is formed by the number corresponding to the number of the core wire 10.

The cover 4 may be a structure wherein the top part and the side face part is made as one body, or it may be a structure being bonded by welding or so.

At the cover 4, at least one window member 8 having the heat resistance and transparent which allows to observe the inside of the reaction chamber 2 is preferably provided. At the outside of the window member 8, for example non-contact type thermometer 38 such as the infrared temperature sensor or so may be provided. The thermometer 38 enables to measure the surface temperature of the rod 20 placed inside the reaction chamber 2; and the measured temperature signal may be input to the control device 32 placed outside the reaction chamber 2.

On the way of the supply line supplying the source material gas to the source material gas supplying port 14, the source material gas flowing amount regulator for regulating the flowing amount of the gas supplied to the inside of the reaction chamber 2 from the source material gas supplying port 14 is installed. The source material gas supplying port 14 and plurality of source material gas discharging port 16 may be provided to the single reaction chamber 2.

The cover 4 and the base board 6 are constituted by heat resistant material such as stainless metal or so, and have double layered structure formed as inner surface and the outer surface. The cooling passage is formed at the inside of double layered structure of each of the cover 4 and the base board 6, and the cover 4 supplies the coolant from the coolant supplying port 15a, and it is cooled by the cooling passage discharging the coolant from the coolant discharging port 17a. The base board 6 supplies the coolant from the coolant supplying port 15b, and it is cooled by other cooling passage discharging the coolant from the coolant discharging port 17b.

On the way of the supply line supplying the coolant to the coolant supplying port 15a and 15b, the coolant flowing amount regulator 42a and 42b are installed in order to regulate the coolant flow amount supplied to the inside of the reaction chamber 2 from the coolant supplying port 15a and 15b. The coolant flowing amount regulator 42a and 42b are regulated by the control device 32, and for example it is constituted by the electromagnetic valve.

On the way of the supplying line supplying the coolant to the coolant supplying port, the temperature detector part 50a and 50b are preferably installed in order to detect the temperature of the coolant supplied to the inside of the reaction chamber 2 from the coolant supplying port 15a and 15b. Also, the temperature detector part 52a and 52b are preferably installed to the discharging line as well where the discharged coolant passes through from the coolant discharging port 17a and 17b; thereby the temperature of the discharged coolant to the coolant discharging port 17a and 17b from the reaction chamber 2 can be detected. The heat removal amount is calculated based on the temperature differences and the coolant flowing amount detected thereby.

The detected temperature signal is input to the control device 32 placed at the outside of the reaction chamber 2.

The coolant discharged from the coolant discharging port 17a and 17b are preferably constituted so that it returns to the coolant supplying port 15a and 15b after being re-cooled by temperature regulation using the heat exchange device which is not shown in the figure; however the coolant may not be re-cooled and the heated coolant can be used for other purpose.

At the electrodes 12 connected to the core wire 10, the electricity supplying means 30 is connected. The electricity supplying means 30 is controlled by the control device 32.

For the production of the rod 20 made by polycrystalline silicon rod 20 by using the above mentioned devices, it is carried out as described in below. That is, the electric conduction to the core wire 10 begins via the electrode 12, and by the electric conduction heat, the temperature of the core wire 10 is heated up to the silicon deposition temperature or higher. The silicon deposition temperature is about 600° C. or higher, but in order to rapidly deposit the silicon on the core wire 10, generally the silicon wire 10 is heated by electric conduction so that the temperature of 900 to 1100° C. or so is maintained.

At the same time as the electric conduction begins, or when the temperature of the core wire 10 reaches to the silicon deposition temperature or higher, the silane gas and the reducing gas are supplied as the source material gas into the reaction chamber 2 from the supplying port 14; thereby the silicon is generated by the reaction of these source material gas (the reducing reaction of silane).

As for the silane gas supplied from the source material gas supplying port 14, a silane compound gas such as monosilane, trichlorosilane, silicon tetrachloride, monochlorosilane, dichlorosilane or so may be used; and in general trichlorosilane gas is suitably used, also as the reducing gas, usually the hydrogen gas is used.

Note that, in the source material gas of the above mentioned, generally the reducing type gas (the hydrogen gas) is used excessively.

Also, as the source material gas, it is possible to generate silicon by thermal decomposition of monosilane, by only supplying the monosilane and without using the reducing gas.

The silicon generated by the above mentioned reaction is deposited on the core wire 10, and by carrying out this reaction continuously, silicon on the core wire 10 grows radially, and at the end the rod 20 made of the polycrystalline silicon can be obtained.

By using the above mentioned polycrystalline silicon rod producing device, the depositing condition of the polycrystalline silicon can be set accordingly, and the polycrystalline silicon rod of the present invention can be obtained.

Specifically, by making the deposition speed of the polycrystalline silicon relatively faster, the coarse crystalline tends to become easy to grow. The polycrystalline silicon rod is obtained by radially growing silicon around the above mentioned core wire 10. When this growth speed is defined by the increasing speed of the rod diameter, the growth speed is preferably 1.1 mm/hour or more, preferably 1.2 to 3.0 mm/hour, more preferably 1.3 to 2.5 mm/hour; thereby the polycrystalline silicon rod of the present invention including many coarse crystalline can be obtained.

The growth speed of the rod is determined mainly by the surface temperature of the rod and the supplying amount of the source material gas. The higher the surface temperature is, the faster the growth speed is. Also, the higher the concentration of the source material gas in the reaction chamber is, the faster the growth speed of the rod is. Note that, by changing the source material gas supplying amount, the source material gas composition ratio, the source gas supplying temperature and the reaction chamber internal pressure; the temperature inside the reaction chamber decreases, the growth speed of the rod declines, or many crystalline growth cores may be generated; thereby the growth of the coarse crystalline may be interfered.

Therefore, by regulating the electric conduction amount to the electrode, the flowing amount of the cooling medium and the source material gas supplying amount or so, the growth speed of the rod can be regulated to a suitable range, and also the growth of the coarse crystalline can be facilitated; thereby the polycrystalline silicon rod including many coarse crystalline can be obtained.

Although it is not be considered in any limited way, as the suitable production condition of the rod of the present invention, the rod surface temperature is 1050 to 1200° C., and more preferably it is 1080 to 1150° C. Also, in case of carrying out the hydrogen reduction of the chlorosilane, it is preferable to regulate the source material gas composition (the ratio of cholorosilane against the total amount of hydrogen and chlorosilane) to 7 mol % to 30 mol %, the gas supplying amount to 0.01 to 0.1 mol/cm$^2$·h, preferably 0.03 to 0.07 mol/cm$^2$·h, and the source gas supplying temperature to 30° C. to 200° C.

As mentioned in above, the reaction is terminated when certain thickness of rod 20 is obtained, then the electric conduction to the core wire 10 is stopped, and after discharging unreacted silane gas, and hydrogen gas, and silicon tetrachloride or hydrogen chloride, which are the byproduct, from the reaction chamber 2, the cover 4 of the bell jar type is opened and the rod 20 is taken out.

Note that, in the present embodiment, after the silicon deposition, it is preferable to carry out the "anneal" in general. Thereby, the distortion formed inside the rod 20 can be effectively solved.

EXAMPLE

Hereinafter, the present invention will be described based on the further detailed example; however the present invention is not to be limited thereto. Note that, in the below example and the comparative example, "the area ratio and the long diameter of the coarse crystal particle" and "the thermal conductivity of the rod" were evaluated as described in below.

The Area Ratio and the Long Diameter of the Coarse Crystal Particle

Figure 3:
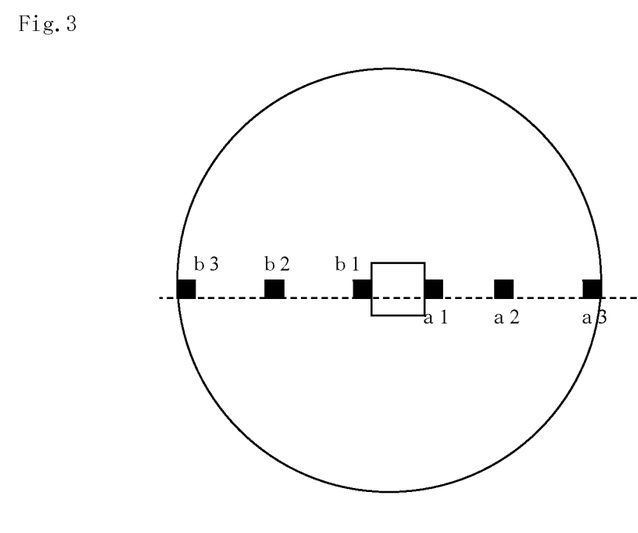
FIG. 3 shows an example of imaged part of the crystalline of the example.

The crystalline observation of the cross section and the crystalline imaging were carried out to 6 points as shown in FIG. 3 with respect to the arbitrary straight line passing through the silicon core wire and the silicon rod outer coat part. The observing points were imaged under the optical microscope connected to the computer by the visual range of 3.5 mm×2.5 mm; thereby the image data was obtained. The obtained image data was analyzed by the image analyzing software; thereby the particle analysis data was obtained. As the image analyzing software, "Azokun" made by Asahi Kasei Engineering Corporation was used. As the contrast setting, the image was divided into the shading of 256 tones, and the concentration of 160 tones were determined as the threshold of the binarization; then the part brighter than the threshold was determined as the particle. In order to exclude the noise and the fine particles, the area less than 50 μm was excluded from this particle area, and the particle size analysis was carried out to remaining area as the coarse particle. By the coarse particle, the long diameter of the coarse particle and the area ratio occupying in the coarse particle were obtained.

The Thermal Conductivity of the Rod

For the measurement of the thermal conductivity, a laser flash method using thermal diffusivity measurement system (production maker: Kyoto Densi Corp., LFA-502) was used. First, the polycrystalline silicon rod 20 was hollowed out approximately perpendicular to the crystalline growth direction, then it was cut approximately perpendicularly to obtain small disk shape silicon sample. The cross section was polished to form a smooth face; thereby the measurement sample was made. Using the sample having the size of 10 mmφ×3 mmt, and the laser pulse light was irradiated to the sample surface. As the irradiated light diffuses to the thickness direction of the sample, the entire test piece will increase its temperature to the uniform temperature (θm). Thereby, a specific heat can be obtained. Next, the heat diffusivity can be obtained from the time that the sample needed to reach to θm/2. The thermal conductivity can be obtained from the below equation. The obtained thermal conductivity is that of the long direction (the axial direction) of the rod.

Thermal conductivity=Specific heat×Thermal diffusivity×Density

Samples 1 to 6

The polycrystalline silicon core wire of the rod shape (the short cross section: the square having one side of 8 mm) was connected, and the silicon core wire having the shape of a reversed U shape with the height of 2000 mm was set in the reaction chamber 2 having 10 rods (5 pairs of reversed U shape), then the silicon core wire 10 was conducted electrically to heat the rod surface up to predetermined temperature. After reaching to the predetermined temperature, the source material gas for silicon deposition (the mixed gas of trichlorosilane and hydrogen) was supplied to the reaction chamber 2, and the amount of the electric conduction, the source material gas supplying amount, and the coolant flowing amount were regulated so that the predetermined rod surface temperature can be maintained; then the polycrystalline silicon rod was deposited until the rod diameter is 120 mm at the rod average growing speed shown in Table 1.

For the obtained rod, "the area ratio and the long diameter of the coarse crystal particle" and "the thermal conductivity of the rod" were measured according to the above methods. The results are shown in Table 1.

Figure 4:
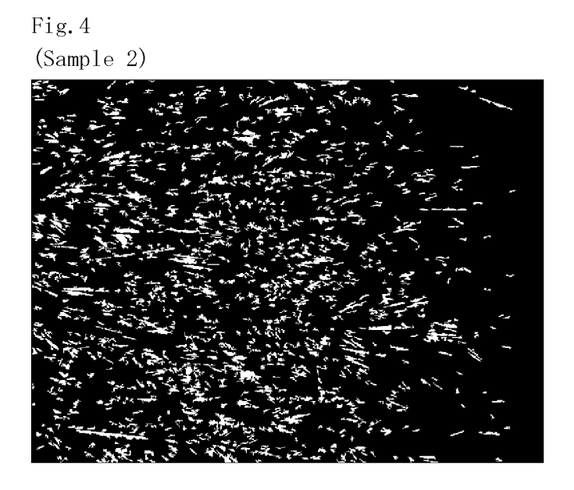
FIG. 4 is a crystalline image of the rod cross section of the sample 2.
Figure 5:
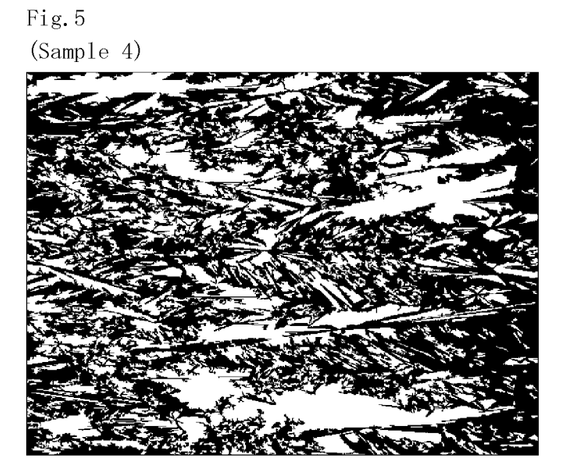
FIG. 5 is a crystalline image of the rod cross section of the sample 4.
Figure 6:
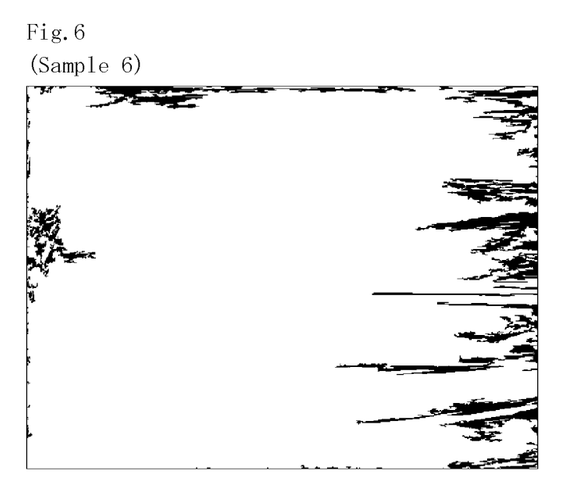
FIG. 6 is a crystalline image of the rod cross section of the sample 6.

Also, FIG. 4 shows the crystalline image at the rod cross section of the sample 2, and in FIG. 5 and FIG. 6, the crystalline image at the rod cross section of the samples of the test pieces 4 and test piece 6 are shown respectively.

Note that, in the aforementioned, the samples 1 to 3 corresponds to the comparative examples of the present invention, and the samples of 4 to 6 corresponds to the examples. Therefore, as mentioned hereinabove, the polycrystalline silicon rod of the present invention has special fine structure and thermal conductivity. This means that the energy amount needed for the melting is less than the same amount of the polycrystalline silicon rod. Therefore, the polycrystalline silicon rod of the present invention can contribute the energy cost reduction when used as the silicon single crystal production source material or as the casting method silicon ingot production method.

TABLE 1

| | Growth condition | | Cross section | | Coarse crystalline | Rod thermal conductivity |
|---|---|---|---|---|---|---|
| | Surface temperature | Average growth speed | Coarse particle area ratio | | Long diameter average value | |
| | °C. | mm/hour | | % | μm | W/m•K |
| Sample 1 | 950 | 0.55 | a-1 | 5.3 | 62.6 | 90 |
| | | | a-2 | 3.9 | 60.4 | |
| | | | a-3 | 4.8 | 59.6 | |
| | | | b-1 | 4.8 | 62.1 | |
| | | | b-2 | 8.6 | 71.9 | |
| | | | b-3 | 8.3 | 71.4 | |
| | | | average | 6.0 | Entire average 64.7 | |
| Sample 2 | 1000 | 0.77 | a-1 | 14.8 | 89.7 | 93 |
| | | | a-2 | 11.4 | 102.6 | |
| | | | a-3 | 12.2 | 97.0 | |
| | | | b-1 | 10.5 | 106.9 | |
| | | | b-2 | 10.7 | 81.6 | |
| | | | b-3 | 10.5 | 89.8 | |
| | | | average | 11.7 | Entire average 94.6 | |
| Sample 3 | 1030 | 0.95 | a-1 | 27.1 | 110.4 | 95 |
| | | | a-2 | 19.3 | 109.7 | |
| | | | a-3 | 14.3 | 100.0 | |
| | | | b-1 | 20.2 | 98.6 | |
| | | | b-2 | 16.9 | 108.5 | |
| | | | b-3 | 15.2 | 98.7 | |
| | | | average | 18.8 | Entire average 104.3 | |
| Sample 4 | 1050 | 1.1 | a-1 | 32.9 | 127.5 | 110 |
| | | | a-2 | 40.9 | 138.4 | |
| | | | a-3 | 29.5 | 121.3 | |
| | | | b-1 | 34.6 | 124.5 | |
| | | | b-2 | 43 | 135.3 | |
| | | | b-3 | 37.2 | 120.9 | |
| | | | average | 36.4 | Entire average 128 | |
| Sample 5 | 1080 | 1.3 | a-1 | 49.2 | 149.0 | 115 |
| | | | a-2 | 52.6 | 143.3 | |
| | | | a-3 | 67.8 | 133.3 | |
| | | | b-1 | 53.3 | 125.5 | |
| | | | b-2 | 59.2 | 136.4 | |
| | | | b-3 | 61.2 | 147.0 | |
| | | | average | 57.2 | Entire average 139.1 | |
| Sample 6 | 1100 | 1.5 | a-1 | 73.5 | 149.2 | 120 |
| | | | a-2 | 85.8 | 171.4 | |
| | | | a-3 | 81.4 | 156.6 | |
| | | | b-1 | 91.7 | 168.9 | |
| | | | b-2 | 88.5 | 157.7 | |
| | | | b-3 | 85.9 | 142.7 | |
| | | | average | 84.5 | Entire average 157.8 | |

NUMERICAL REFERENCES

2 . . . Reaction chamber
4 . . . Cover
6 . . . Base board
8 . . . Window member
9 . . . Cooling passage
10 . . . Core wire
11 . . . Coarse crystal particle
12 . . . Electrode
14 . . . Source material gas supplying port
16 . . . Source material gas discharging port
15a, 15b . . . Coolant supplying port
17a, 17b . . . Coolant discharging port
20 . . . Rod
30 . . . Electricity supplying means
32 . . . Controlling device
38 . . . Non-contact type thermometer
42a, 42b . . . Coolant flowing amount regulator
50a, 50b, 52a, 52b . . . Temperature detecting part

The invention claimed is:

1. A polycrystalline silicon rod, comprising:
   a silicon core wire; and
   radially-deposited polycrystalline silicon including needle shape crystals around the silicon core wire,
   wherein the polycrystalline rod has a column shape, and
   wherein, at a cross section face of the polycrystalline silicon rod perpendicular to an axial direction, an area ratio of needle shape crystals having a long diameter of 50 μm or more is 35% or more among crystals observed at the cross section face excluding the silicon core wire.

2. The polycrystalline silicon rod as set forth in claim 1, wherein said needle shape crystals have an average long diameter of 50 to 1000 μm.

3. The polycrystalline silicon rod as set forth in claim 1, wherein a diameter of the polycrystalline silicon rod is 90 to 180 mm.

4. The polycrystalline silicon rod as set forth in claim 1, wherein a thermal conductivity of the axial direction of the polycrystalline silicon rod excluding the core wire is 100 to 150 W/m K.

5. A method of producing a single crystal, comprising:
   melting the polycrystalline silicon rod as set forth in claim 1 as a source material; and producing a single crystal in a Czochralski method or a silicon ingot by a casting method.

6. The polycrystalline silicon rod as set forth in claim 1, wherein a length of said needle shape crystals extend in a radial direction of the polysilicon rod.

7. The polycrystalline silicon rod as set forth in claim 1, wherein the long diameter of said needle shape crystals is radially disposed around the silicon core wire.

8. The polycrystalline silicon rod as set forth in claim 1, wherein a length of said needle shape crystals extend radially in between the silicon core wire and a surface of polycrystalline silicon rod.

9. The polycrystalline silicon rod as set forth in claim 1, wherein said needle shape crystals have an average long diameter of 50 to 157.8 µm.

10. The polycrystalline silicon rod as set forth in claim 1, wherein said needle shape crystals have an average long diameter of 70-800 µm.

11. The polycrystalline silicon rod as set forth in claim 1, wherein the area ratio of needle shape crystals having a long diameter of 50 µm or more is 36.4% or more among crystals observed at the cross section face excluding the silicon core wire.

12. The polycrystalline silicon rod as set forth in claim 1, wherein the area ratio of needle shape crystals having a long diameter of 50 µm or more is 57.2% or more among crystals observed at the cross section face excluding the silicon core wire.

13. The polycrystalline silicon rod as set forth in claim 1, wherein at a cross section face of the polycrystalline silicon rod perpendicular to an axial direction, the area ratio of needle shape crystals having a long diameter of 128 µm or more is 35% or more among crystals observed at the cross section face excluding the silicon core wire.

14. The polycrystalline silicon rod according to claim 1, comprising an as-grown polycrystalline silicon rod.

15. The polycrystalline silicon rod according to claim 1, wherein the area ratio of needle shape crystals having the long diameter of 50 µm or more is 35% or more and 84.5% or less among crystals observed at the cross section face excluding the silicon core wire.

16. The polycrystalline silicon rod according to claim 1, wherein the area ratio of needle shape crystals having the long diameter of 50 µm or more is 35% or more and 91.7% or less among crystals observed at the cross section face excluding the silicon core wire.

17. The polycrystalline silicon rod according to claim 1, wherein the silicon core wire comprises polycrystalline silicon.

18. The polycrystalline silicon rod as set forth in claim 1, wherein a cross section shape of the silicon wire is approximately square.

19. A polycrystalline silicon rod, comprising:
a silicon core wire; and
polycrystalline silicon comprising needle-shaped crystals that are radially-deposited around the silicon core wire and have a long diameter of 50 µm or more,
wherein at a cross section of said rod perpendicular to an axial direction of said rod, said polycrystalline silicon needle-shaped crystals comprise 35% or more of an area of the cross section excluding the silicon core wire.

20. The polycrystalline silicon rod as set forth in claim 19, wherein a length of said needle-shaped crystals extend in a radial direction of the polysilicon rod.

21. The polycrystalline silicon rod as set forth in claim 19, wherein the long diameter of said needle-shaped crystals are radially disposed around the silicon core wire.

22. The polycrystalline silicon rod as set forth in claim 19, wherein a length of said needle-shaped crystals extend radially in between the silicon core wire and a surface of polycrystalline silicon rod.

* * * * *